United States Patent [19]

Yamamoto

[11] 4,365,181
[45] Dec. 21, 1982

[54] PIEZOELECTRIC VIBRATOR WITH DAMPING ELECTRODES

[75] Inventor: Takashi Yamamoto, Oshimizumachi, Japan

[73] Assignee: Murata Manufacturing Co., Ltd., Japan

[21] Appl. No.: 168,285

[22] Filed: Jul. 10, 1980

[30] Foreign Application Priority Data

Jul. 18, 1979 [JP] Japan ............................ 54-99913[U]
May 26, 1980 [JP] Japan ............................ 55-72778[U]

[51] Int. Cl.³ .......................................... H01L 41/08
[52] U.S. Cl. .................................. 310/320; 310/327;
310/365; 310/366; 310/364; 310/340; 310/344;
310/348
[58] Field of Search ............... 310/326, 327, 320, 340,
310/344, 364, 365, 366; 333/191, 192

[56] References Cited

U.S. PATENT DOCUMENTS

| 3,359,435 | 12/1967 | Webb | 310/344 X |
| 3,396,287 | 8/1968 | Horton | 310/344 X |
| 3,483,402 | 12/1969 | Royer | 310/326 |
| 3,684,905 | 8/1972 | Martyn | 310/326 |
| 3,699,484 | 10/1972 | Berlincourt | 310/320 X |
| 4,037,180 | 7/1977 | De Wild | 333/191 |
| 4,196,407 | 4/1980 | Masaie et al. | 310/326 X |

Primary Examiner—Mark O. Budd
Attorney, Agent, or Firm—Ostrolenk, Faber, Gerb & Soffen

[57] ABSTRACT

A piezoelectric vibrator includes an elongated piezoelectric plate deposited with electrodes for effecting mechanical vibration in the piezoelectric plate. A damper is deposited at each of opposite ends of the elongated piezoelectric plate so as to reduce the size of the piezoelectric plate.

17 Claims, 29 Drawing Figures

PIEZOELECTRIC VIBRATOR WITH DAMPING ELECTRODES

BACKGROUND OF THE INVENTION

The present invention relates to a vibrator employing a piezoelectric ceramic and, more particularly, to an assembly of the piezoelectric vibrator of the energy trapped type producing vibration in thickness mode.

Conventionally, there have been proposed various types of the above described oscillator which is suitable for use in filters, resonators, oscillators, traps and discriminators. A typical piezoelectric vibrator is shown in FIGS. 1a and 1b and includes a thin plate 1 made of piezoelectric ceramic material, a pair of electrodes 2a and 2b deposited on opposite flat surfaces of the plate 1 in face-to-face relation to each other at approximately center portion of the plate 1, an intervening electrode 3a extending from the electrode 2a towards a terminal electrode 4a located at a corner of the plate 1, and an intervening electrode 3b extending from the electrode 2b towards a terminal electrode 4b located at another corner of the plate 1. A pair of terminal legs 5a and 5b extend from the terminal electrodes 4a and 4b, respectively, for the external electrical connection to the electrodes 2a and 2b. When alternating electrical potential is applied between the electrodes 2a and 2b, an alternating electric field is generated that causes localized vibration in the plate 1 between the electrodes 2a and 2b. The vibration is propagated radially towards the edges of the plate 1 in a form of thickness shear or thickness expansion mode to give rise an oscillation in the plate 1. Since the oscillation is mainly carried out in the center vibrating portion of the plate 1, the vibrating energy can be trapped in the center portion of the plate 1 as understood from the theory of energy trap. Therefore, even if an inactive portion or a portion which scarcely vibrates is held tightly, the vibration occurring at the center active portion can be activated without any disturbance. Accordingly, the conventional vibrator is further provided with a coating 6 which completely surrounds the plate 1 with cavities 7a and 7b formed around the electrodes 2a and 2b. The coating 6 serves as a damper to hold the non-vibrating portion of the plate 1, and also to suppress the unwanted waves.

Another prior art vibrator is shown in FIGS. 2a and 2b having a first pair of separate electrodes 8a and 8b and a second pair of separate electrodes 9a and 9b deposited on one flat surface of the plate 1. Ground, or counter, electrodes 10 and 11 are deposited on the other flat surface of the plate 1 at places corresponding the first and second separate electrodes 8 and 9, respectively. The separate electrodes 8a and 9a are connected with each other and the separate electrodes 8b and 9b are connected to terminal legs 5a and 5b, as shown. The ground electrodes 10 and 11 are connected to a terminal leg 5c. This prior art vibrator, which is generally called a double unit type in contrast with a single unit type shown in FIGS. 1a and 1b, is also provided with coating 6.

The above described prior art vibrators are disadvantageous in that the plate 1 must be considerably large to enable the deposition of terminal electrodes 4a and 4b and also to apply the coating 6 and that the terminal legs are required for the external electrical connection. Furthermore, the step necessary to provide the coating 6 increases the manufacturing cost.

Accordingly, a primary object of the present invention is to provide a piezoelectric vibrator of the above described type which is compact in size and simple in construction.

It is another object of the present invention to provide a piezoelectric vibrator of the above described type which can be readily manufactured at low cost.

BRIEF DESCRIPTION OF THE INVENTION

In accomplishing these and other objects, a piezoelectric vibrator according to one preferred embodiment of the present invention comprises an elongated piezoelectric plate, a first electrode deposited approximately at a center portion on one flat or plane surface of the piezoelectric plate and a second electrode deposited approximately at a center portion on the other flat surface of the piezoelectric plate in face-to-face relation with the first electrode. The first and second electrodes are adapted to receive electrical signals that cause mechanical oscillation in the piezoelectric plate. A first damping means is applied at a first end edge portion of the elongated piezoelectric plate entirely along a width of the elongated piezoelectric plate. A second damping means is applied at a second end edge portion of the elongated piezoelectric plate entirely along a width of the elongated piezoelectric plate.

A piezoelectric vibrator according to another preferred embodiment of the present invention comprises an elongated piezoelectric plate having first and second half portions on respective sides of the center line drawn in a direction widthwise of the elongated piezoelectric plate at a portion intermediate of the length of the piezoelectric plate. A first electrode is deposited approximately at a center portion of the first half portion and on one flat surface of the piezoelectric plate, and a second electrode is deposited approximately at a center portion of the first half portion and on the other flat surface of the piezoelectric plate in face-to-face relation with the first electrode. The first and second electrodes are adapted to receive electrical signal that causes mechanical oscillation in the first half portion of the elongated piezoelectric plate. Similarly, third and fourth electrodes are deposited approximately at a center portion of the second half and on one and the other flat surfaces, respectively, of the piezoelectric plate in face-to-face relation with each other. The third and fourth electrodes are adapted to receive electrical signal that causes mechanical oscillation in the second half portion of the elongated piezoelectric plate. First and second damping means are applied at first and second end edge portions, respectively, of the elongated piezoelectric plate entirely along a width of the elongated piezoelectric plate. A third damping means is further applied at a center portion of the elongated piezoelectric plate along the center line.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIG. 1b is a cross sectional view taken along a line Ib—Ib shown in FIG. 1a;

FIG. 2b is a cross sectional view taken along a line IIb—IIb shown in FIG. 2a;

FIG. 3b is a cross sectional view taken along a line IIIb—IIIb shown in FIG. 3a;

FIG. 8b is a cross sectional view taken along a line VIIIb—VIIIb shown in FIG. 8a;

FIG. 10b is a cross sectional view taken along a line Xb—Xb shown in FIG. 10a;

FIG. 12 is an enlarged fragmentary view of the vibrator of FIG. 11a;

FIG. 13 is an equivalent circuit diagram of the vibrator of FIG. 11a;

FIG. 14 is a perspective view of a vibrator according to a further modification of the vibrator of FIG. 10a;

FIG. 21 is a perspective view showing a vibrator according to still further modification of the vibrator of FIG. 10a.

DETAILED DESCRIPTION OF THE PREFERRED EMBODIMENTS

Figure 3A:
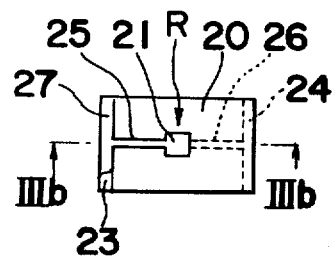
FIG. 3a is a top plan view of a vibrator according to one embodiment of the present invention.
Figure 3B:
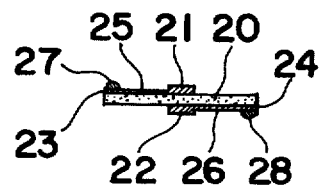

Referring to FIGS. 3a and 3b, there is shown a piezoelectric vibrator according to one embodiment of the present invention. The piezoelectric vibrator shown is a single unit type and includes an elongated rectangular thin plate 20 made of a piezoelectric ceramic material, such as, lead zirconic titanate, which has been sintered. A single-mode energy trapped type resonator R is constituted in the plate 20 which is particularly suitable for use in a trap or oscillator. The resonator R includes electrodes 21 and 22 which are deposited on opposite flat surfaces of the plate 20 approximately at a center portion thereof in face-to-face relation to each other. On the surface of the plate 20 provided with the electrode 21, there is provided a belt electrode 23 which extends along a short side edge portion of the plate 20 in its widthwise direction. Similarly, on the other surface of the plate 20 provided with the electrode 22, there is provided a belt electrode 24 which extends along the other short side edge portion of the plate 20 in widthwise direction. The center electrode 21 and the belt electrode 23 are connected to each other through an intervening electrode 25, and the center electrode 22 is connected through an intervening electrode 26 to the belt electrode 24. A suitable amount of solder forming a bead 27 is deposited along the entire length of the side electrode 23. In the drawing, solder bead 27 is partly removed for the purpose of showing electrode 24 lying under the solder bead. Likewise, a solder bead 28 is deposited along the entire length of the side electrode 24. Each of the solder beads 27 and 28 serve as a damping means to reduce the size of the plate 20 in the widthwise direction as described later. Furthermore, since the solder beads 27 and 28 suppress unwanted waves, it is not necessary to provide any coating around the vibrator of the present invention.

Figure 4A:
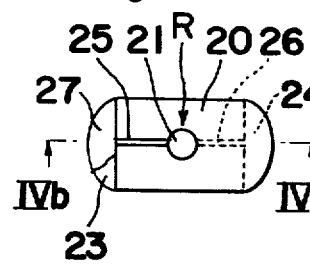
FIGS. 4a and 4b are views similar to FIGS. 3a and 3b, but particularly show a modification thereof.
Figure 5A:
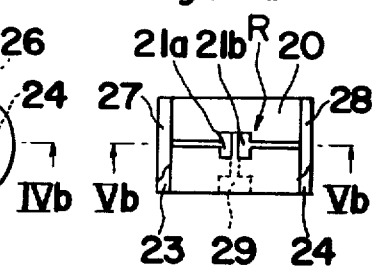
FIGS. 5a and 5b are views similar to FIGS. 3a and 3b, but particularly show a further modification thereof.
Figure 4B:
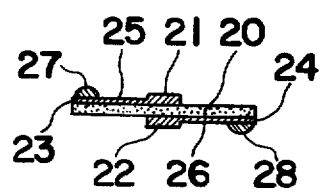
Figure 5B:
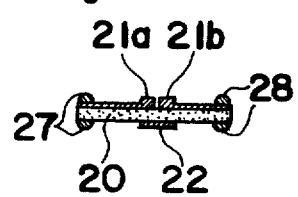
Figure 6:
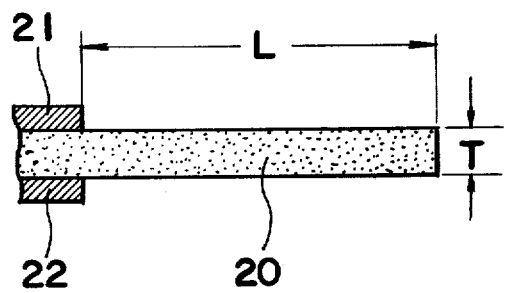
FIG. 6 is a cross sectional view of a principle type piezoelectric vibrator.

It is to be noted that plate 20 can be prepared in any other shape than the rectangular shape, such as, oval, as shown in FIGS. 4a and 4b. Furthermore, one center electrode, e.g., 21 can be presented as a set of separate electrodes 21a and 21b, as shown in FIGS. 5a and 5b. In this case, the separate electrodes 21a and 21b should preferably be connected to the side electrodes 23 and 24, respectively, while the other center electrode 22 should preferably be connected to a terminal 29 located at a long side edge of the plate 20. Moreover, the solder beads 27 and 28 can be provided on opposite sides surfaces of the plate 20, as shown in FIG. 5b. When the separate electrodes are employed, the vibrator can be used as a multi-mode energy trapped type filter or discriminator.

Figure 8A:
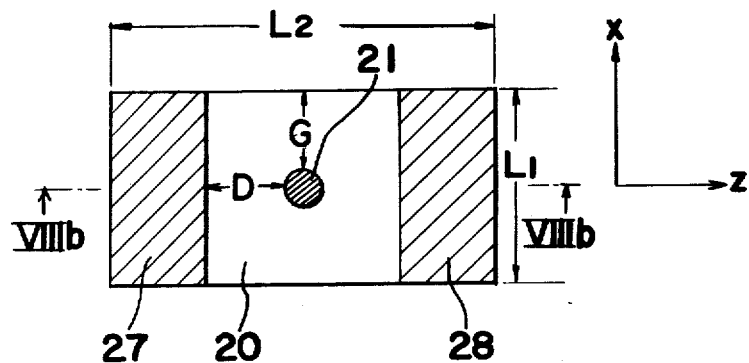
FIG. 8a is a diagrammatic view of a vibrator of the present invention.
Figure 8B:
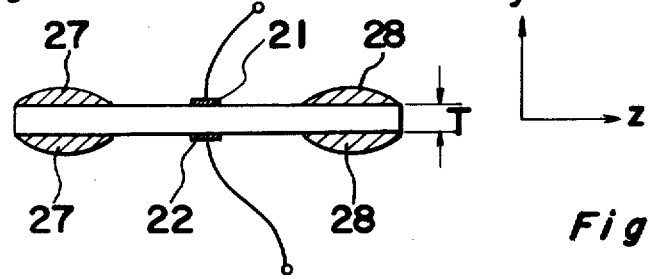

Although a method of depositing damping means at opposite ends of the elongated piezoelectric plate is disclosed in U.S. Pat. No. 3,676,724 of Berlincourt et al., this reference does not teach the method of depositing such damping means entirely along the width of the piezoelectric plate. Furthermore, this patent takes no consideration as to the reduction of size of the piezoelectric plate. In contrast, as a result of the deposition of a damper entirely along the width of the piezoelectric plate, the piezoelectric plate employed in the vibrator of the present invention can be reduced to approximately half the size of the plate employed in the conventional vibrator. The reason for enabling this reduction in size is explained below. In a test of the vibrator of FIGS. 8a and 8b, the mechanical quality factor Q in X-direction was measured as the length D between the edge of the center electrode 21 and the edge of the damper is changed. The change of the length D was changed by changing the area and mass of the solder bead deposited on the plate 20.

Figure 7:
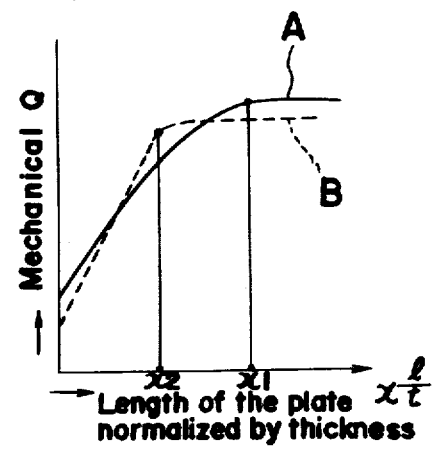
FIG. 7 is a graph showing relation between the mechanical quality factor Q and length of the piezoelectric plate.

In the graph of FIG. 7, the curves A and B saturate or reach maximum value at a point where the propagated waves fade out. Therefore, as to the curve A, waves fade out at a point X1 and, as to the curve B, waves fade out at a point X2. In other words, if the thickness T is unity, the active area in the plate 20 of the principle type falls within a distance X1 from the edge of the center electrode, whereas the active area in the plate 20 of the present invention falls within the distance X2 from the edge of the center electrode. Since X2<X1, and since the inactive portion can be removed from the plate 20, it can be said that the vibrator according the present invention may employ a smaller plate 20 than is required for the principle type vibrator. From a theoritical stand point, the reduction of size of the plate 20 can be explained as follows.

Figure 9:
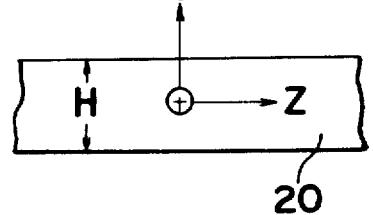
FIG. 9 is a diagrammatic view presented for the explanation of wave travel through the piezoelectric plate.

The theoretical idealized piezoelectric ceramic plate 20 is shown in FIG. 9. The ideal piezoelectric ceramic plate 20 is placed in X-Z plane, and is polarized in X-direction as in a manner similar to R1 and R2 plates in crystal. The dimensions of the plate 20 is such that its length in X-direction is infinitely long. Only a wave propagating in Z-direction with a deflection in X-direction, which is a so-called SH wave, will be considered. Unlike crystals, the piezoelectric ceramic plate 20 has a considerable piezoelectrical reaction, and there rises a problem of electrical boundary condition when the waves are propagated. For the sake of brevity, however, these reactions and conditions are not taken into consideration in the following theoretical consideration. When the opposite flat surfaces of the ideal piezoelectric plate 20 are free from any objects, the degree of deflection D in Z-direction can be expressed as follows:

$$D = A\cos\left(\frac{n\pi y}{T}\right) \exp j(\omega t + \beta z) \quad (1)$$

in which A is a constant, T is a thickness of plate 20, $\omega$ is a circular frequency, and $\beta$ is a propagation constant in Z-direction. Also, $\beta$ can be expressed as follows:

$$\beta = \frac{n\pi}{T} \sqrt{\left(\frac{fo}{nfo'}\right)^2 - 1} \quad (2)$$

in which fo' (fo'>fo) is a fundamental frequency of waves in thickness shear mode propagating through infinitely broad plate, and n is a number representing the harmonic number.

When the plate 20 is provided with damping means, such as solder beads 27 and 28 entirely along the width of the plate 20, the constant A changes its value to A' which is smaller than A. Therefore, the equation (1) can be expressed as follows:

$$D = A' \cos (n\pi y/T) \exp j(\omega t + \beta z) \quad (3)$$

If the waves propagated in X-direction were present, their deflection D can be expressed as follows:

$$D = A'\alpha \cos (n\pi y/T) \exp j(\omega t + \beta x) \quad (4)$$

$$(A/A') > \alpha > 1 \quad (5)$$

Since the waves are exponentially attenuated in the frequency domain of fo>fo', and since A'<A'α(<A) from the equations (3), (4) and (5), the distance needed to obtain a certain magnitude of deflection Do changes from Xa to Xb (Xa>Xb). This change corresponds to the change in the point (i.e. from X1 to X2), at which the quality factor Q reaches the maximum. Test results indicate that the distance G (FIG. 8a) between the edge of the center electrode 21 and the edge of the long side of the plate 20 divided by the thickness T should preferably between 0 and 15. This relation can be expressed as $0 \leq G/T \leq 15$.

Figure 10A:
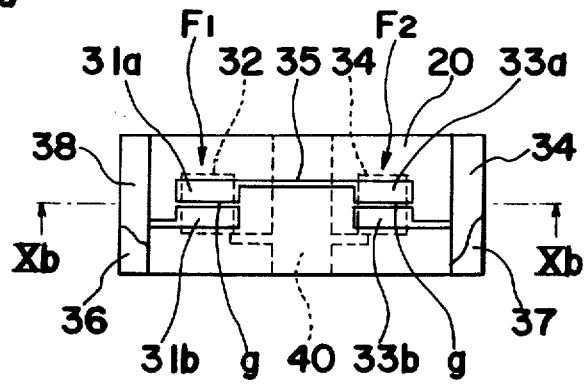
FIG. 10a is a top plan view of an oscillator according to another embodiment of the present invention.
Figure 10B:
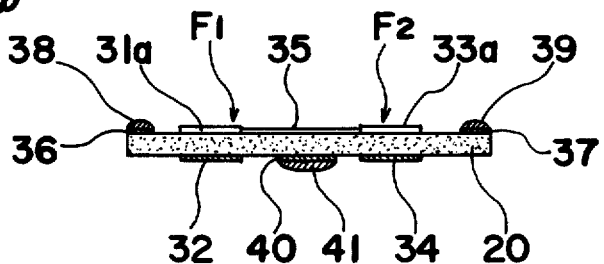

Referring to FIGS. 10a and 10b, there is shown a double unit type vibrator according to a second embodiment of the present invention. The vibrator shown includes two sets of multi-mode energy trapped type filters F1 and F2. The first filter F1 located approximately at a center portion of left-hand half of the elongated plate 20 in FIG. 10a, has a first pair of separate electrodes 31a and 31b which are deposited on one surface of the elongated rectangular piezoelectric ceramic plate 20 in side-by-side relation to each other with a predetermined gap g taken therebetween. A counter electrode 32 is deposited on the other flat surface of the piezoelectric plate 20 in face-to-face relation with the first separate electrodes 31a and 31b. The second filter F2, located approximately at a center portion of right-hand half of the plate 20, has a second pair of separate electrodes 33a and 33b. Their counter electrode 34 is deposited in a manner similar to those in the first filter F1. The separate electrode 31a of the first filter F1 and the separate electrode 33a of the second filter F2 are electrically connected to each other through an intervening electrode 35.

To enable the deposit of damping means, such as solder beads 38 and 39, at opposite ends of the elongated plate 20, electrodes 36 and 37 in a form of belt are provided along the opposite short side edge portions of the plate 20. It is to be noted that the damping means can be other than a solder bead, such as an electrically conductive bonding agent. Although any material can be used for the damping means, a material having a high specific gravity is preferable. The belt electrodes 36 and 37 are connected to the separate electrodes 31b and 33b, respectively, to allow external electrical connection of the separate electrodes 31b and 33b through the belt electrodes 36 and 37. A similar belt electrode 40 is provided across the center portion of the plate 20 on the surface provided with the counter electrodes 32 and 34. A solder bead 41, serving as a damping means, is deposited on the belt electrode 40. The damping means defined by the solder bead 41 is also provided for preventing the signal interference between the filters F1 and F2. The belt electrode 40 is connected to the counter electrode 32 and 34 allow external electrical connection of the counter electrodes 32 and 34.

Since the damping means 38, 39 and 41 are provided, the vibrator of this second embodiment can also be compact. For example, in the case of vibrator particularly designed for use in filtering FM intermediate frequency signals, e.g., 10.7 MHz, the conventional vibrator has a dimension of 7×5×0.2 (mm), whereas the vibrator of the present invention has a dimension of 7×2.5×0.2 (mm).

Figure 11A:
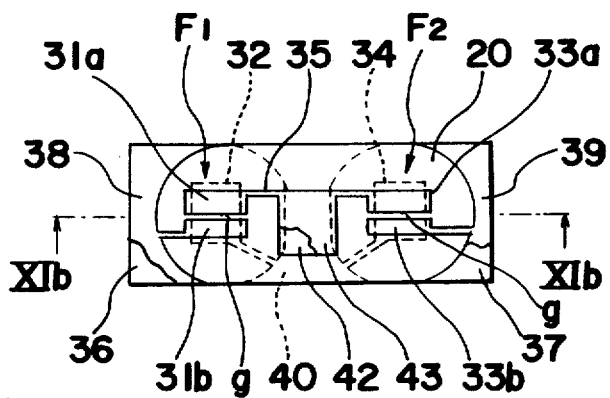
FIGS. 11a and 11b are views similar to FIGS. 10a and 10b, but particularly show a modification thereof.
Figure 11B:
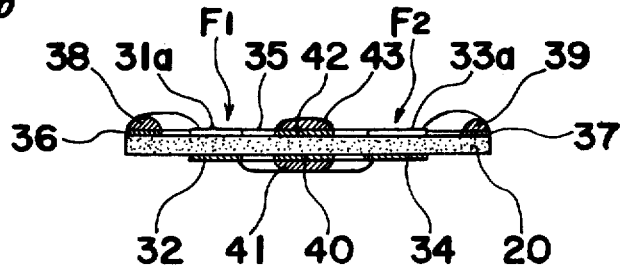
Figure 13:
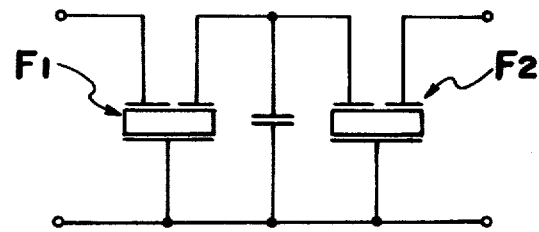

Referring to FIGS. 11a and 11b, there is shown a modification of the double unit type vibrator, particularly suitable for use in filter. The vibrator shown further includes, when compared with the vibrator of FIG. 10a, a rectangular electrode 42 extending from the intervening electrode 35 and in a face-to-face relation with the electrode 40, so as to define a capacitor between the electrodes 40 and 42. Accordingly, an equivalent circuit for the vibrator of FIGS. 11a and 11b is as shown in FIG. 13.

Preferably, to increase the damping effect, a solder bead 43 is deposited on the rectangular electrode 42. Moreover, the edge of the electrodes 36, 37 and 40 facing the filters F1 and F2 may be arced to increase the area available to deposite the solder beads.

Figure 12:
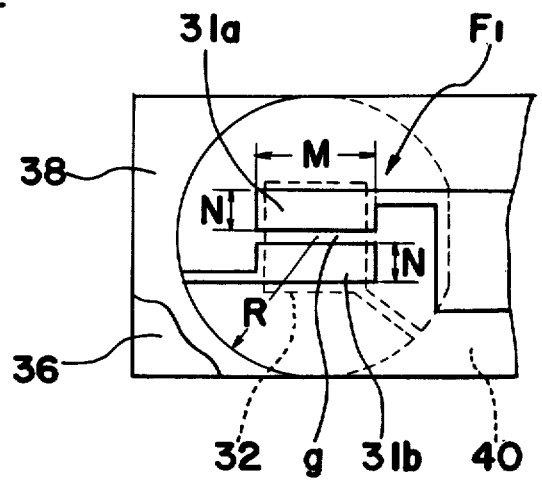

When the solder beads are increased in size, it is possible to further reduce the size of the vibrator, particularly, by way of narrowing the distance between the filters F1 and F2. For example, when each of the separate electrodes has a dimension of length M=1.0 mm and width N=0.45 mm with a gap g between separate electrodes being 0.2 mm, and when the edges of the electrodes 36, 40 and 37 lie along a circle having its center at the center of the respective filter and radius R=1.8 mm, as shown in FIG. 12, the size of the vibrator can be considerably reduced when compared with conventional vibrators provided with casing, for example, 1/50 from the view point of volume.

Figure 14:
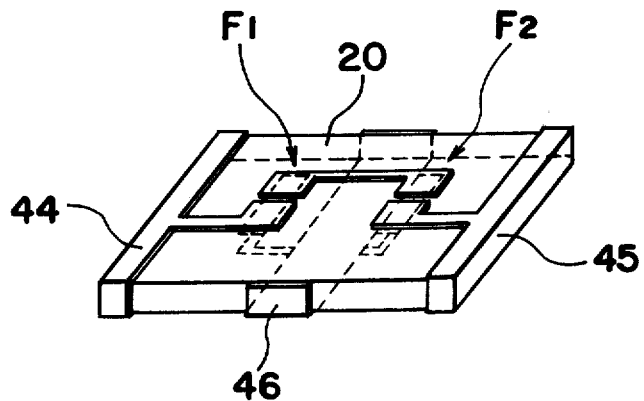
Figure 21:
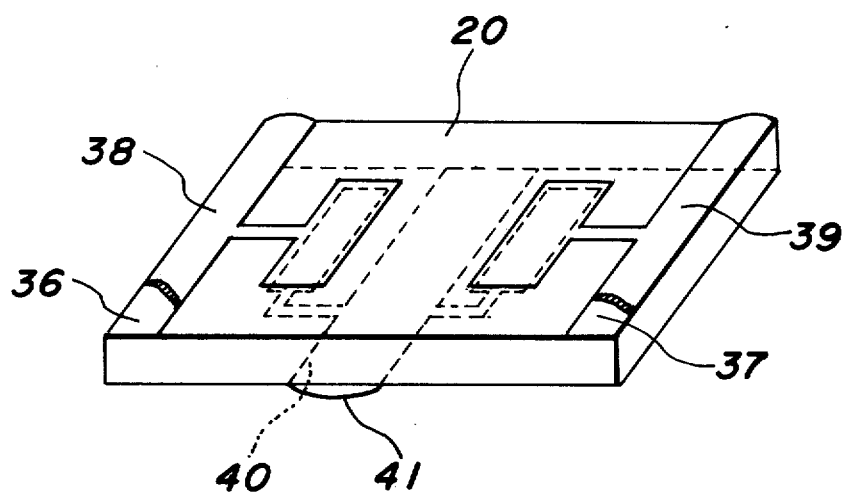

Referring to FIG. 14, there is shown a further modification of the double unit type vibrator which may be used in a filter. The vibrator shown has a pair of cap members 44 and 45 made of metal film and deposited at the opposite ends of the elongated plate 20 for the damping means. A U-shaped metal 46 is deposited across the center of the elongated plate for the center damping means. It is to be noted that the separate electrodes 31a and 31b or 33a and 33b can be integrally formed, as shown in FIG. 21.

A manner for effecting external electrical connection of the vibrator of the present invention will now be described. The examples of connecting methods described below are given in connection with the vibrator of double unit type. It is needless to say, however, that such methods can also be applied to the vibrator of single unit type.

Figure 15:
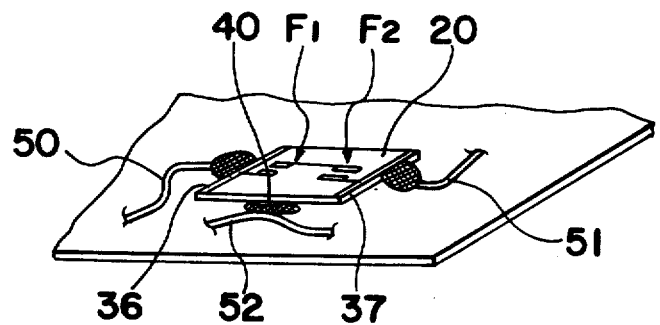
FIG. 15 is a perspective view showing one method for carrying out external electrical connection to the vibrator of the present invention.

Referring to FIG. 15, there is shown a first method for effecting external electrical connection of the vibrator. Since it is not necessary to provide any coating around the vibrator of the present invention, and since the solder beads can mechanically reinforce the piezoelectric plate, the vibrator of the present invention can be directly connected to lead wires or electrodes printed on the board by soldering. For example, in the case of vibrator of FIG. 10a, the electrodes 36, 37 and 40 can be directly connected to lead wires 50, 51 and 52, respectively, as shown.

Figure 16:
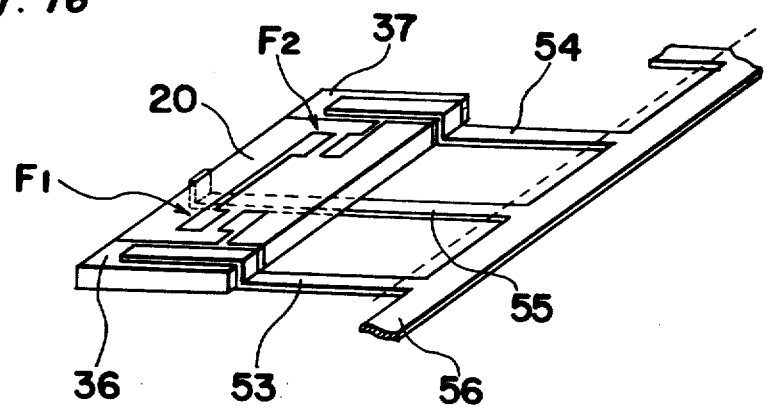
FIG. 16 is a perspective view showing another method for carrying out external electrical connection to the vibrator of the present invention.

Referring to FIG. 16, there is shown a second method for effecting external electrical connection of the vibrator. According to this method, there is provided three terminal legs 53, 54 and 55 extending from the electrodes 36, 37 and 40, respectively. For facilitating the attaching process of the terminal legs, a belt 56 which is integrally provided with terminal legs disposed with a predetermined pitch is used. After properly positioning the terminal legs, solder beads are deposited over the respective electrodes. Since the terminal legs are disposed along the belt 56 with a predetermined pitch, the terminal legs can be located at their proper positions without any adjustment. After the terminal legs have been attached, the legs are cut to detach the legs from the elongated belt. Since the terminal legs have considerable weight, they can be extended along the belt electrodes to use them as damping means.

Figure 17:
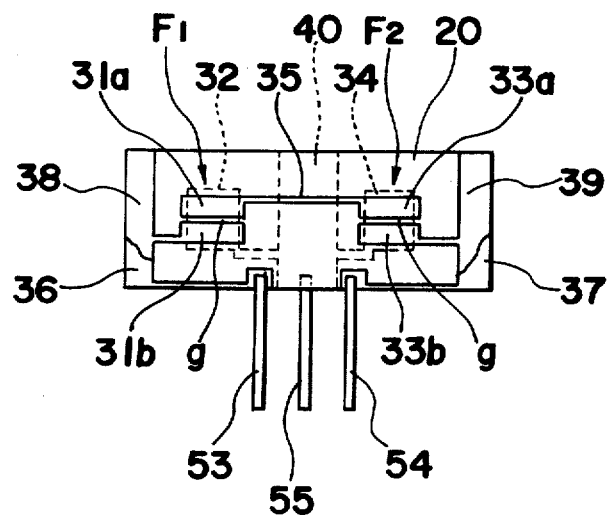
FIG. 17 is a top plan view showing a further method for carrying out external electrical connection to the vibrator of the present invention.

In the case where the legs should be located considerably close to each other to meet the standarized requirement, the electrodes 36 and 37 can be extended towards to the center electrode 40, as shown in FIG. 17, for presenting the portions available to attach the terminal legs close to each other.

Figure 18:
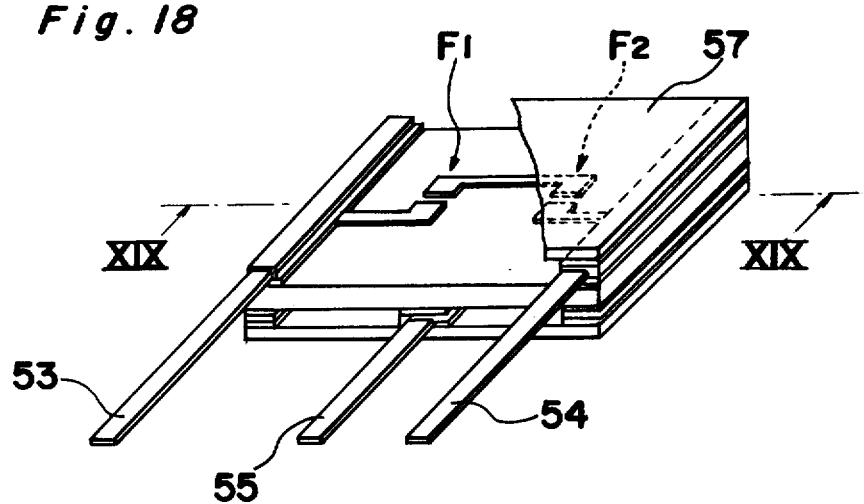
FIG. 18 is a perspective view showing a method for applying guard plates to the vibrator of the present invention.
Figure 19:
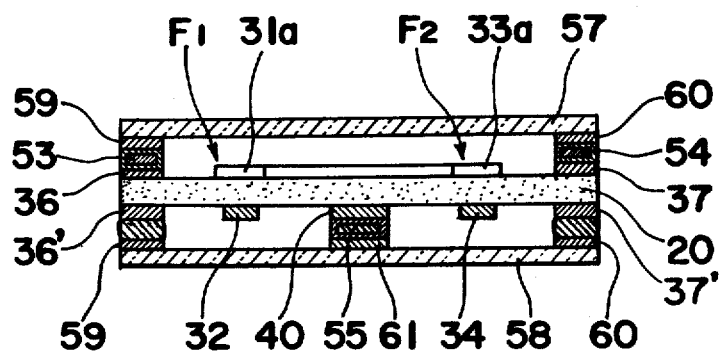
FIG. 19 is a cross sectional view taken along a line XIX—XIX shown in FIG. 18.
Figure 20:
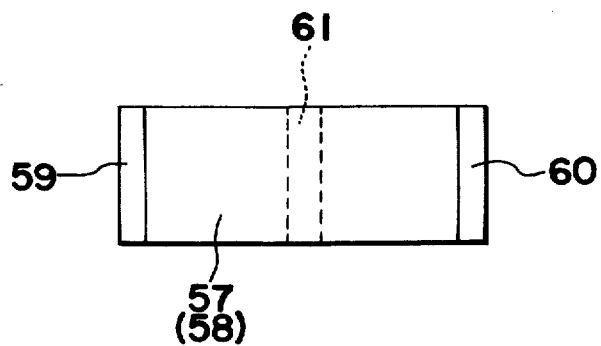
FIG. 20 is a top plan view of a guard plate.

Referring to FIGS. 18 and 19, there is shown a method for applying terminal legs and guard plates to the vibrator of the present invention. A pair of guard plates 57 and 58, made of glass and each having a configuration identical to the elongated plate 20 are prepared. The guard plate 57 which is to be positioned on the side of the vibrator provided with the separate electrodes 31a, 31b, etc., has metal strips 59 and 60 deposited along its short side edges, as shown in FIG. 20 through any known method, such as, a vacuum deposition. On the other hand, the guard plate 58 which is to be positioned on the side of the vibrator provided with the counter electrodes 32 and 34 has, in addition to the strips 59 and 60 at its opposite short sides, a center strip 61 across the glass plate as shown by a dotted line in FIG. 20. On each metal strip 59, 60 or 61, a solder bead is previously deposited. The guard plates 57 and 58 and terminal legs 53, 54 and 55 are provided on the vibrator in the following manner.

Figure 1A:
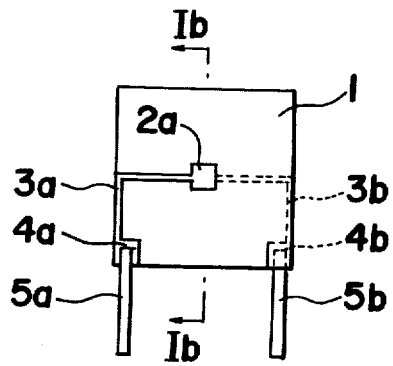
FIG. 1a is a top plan view of a prior art vibrator.
Figure 1B:
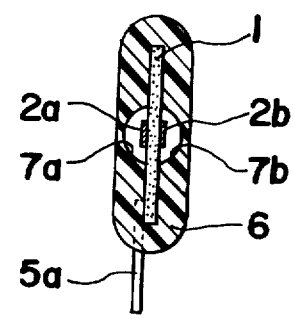
Figure 2A:
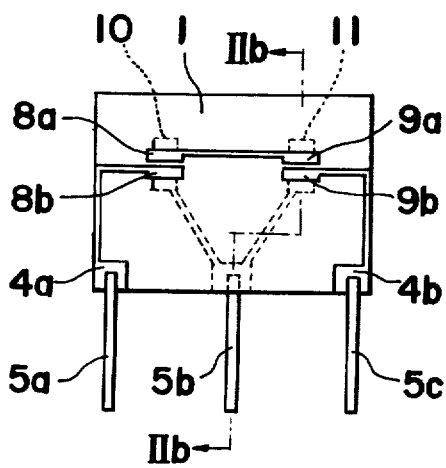
FIG. 2a is a top plan view of another prior art vibrator.
Figure 2B:
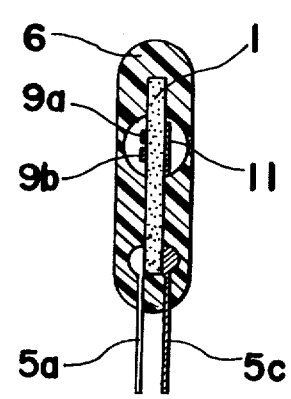

The terminal legs 53 and 54 are temporarily held between the glass plate 57 and the plate 20 at locations as shown in FIG. 18. Then, a slight pressure is applied to the glass plate 57 to press the terminal legs 53 and 54 between the plates 57 and 20 and, at the same time, heat is applied to the terminal legs 53 and 54 for melting the solder beads on the glass plate 57. When the terminal legs 53 and 54 are cooled down, they are rigidly soldered between the plates 20 and 57. The terminal leg 55 is soldered between the plates 20 and 58 in a similar manner described above. For balancing the pressure applied to the glass plate 58, it is preferably to deposite more amount of solder bead over the metal strips 59 and 60 of the plate 58 than that in the center strip 61. Furthermore, for the rigid connection of the glass plate 58 to the plate 20 and for increasing the damping effect, it is preferable to provide belt electrodes 36' and 37' at locations corresponding to the metal strips 59 and 60, respectively. Since there are provided predetermined spaces between the piezoelectric plate and the respective glass plates, the filters F1 and F2 can be oscillated without any hindrance. In the arrangement described above in connection with FIGS. 18 and 19, a coating such as made of a synthetic resin can be further provided over the glass plates. Furthermore, in the case where the guard plates, e.g., 57 and 58 are not provided, synthetic resin coating, such as those shown in FIGS. 1b and 2b can be provided on the vibrator of the present invention.

Although the present invention has been fully described with reference to several preferred embodiments, many modifications and variation thereof will now be apparent to those skilled in the art, and the scope of the present invention is therefore to be limited not by the details of the preferred embodiments described above, but by the terms of appended claims.

What is claimed is:

1. A piezoelectric vibrator of the energy trapping type which operates in the thickness vibrational mode, comprising:

an elongated ceramic piezoelectric plate having first and second opposed planar surfaces, and having opposite pairs of lengthwise and widthwise edges;

a first electrode deposited approximately at a center portion on said first planar surface of said piezoelectric plate;

a second electrode deposited approximately at a center portion on said second planar surface of said piezoelectric plate in face-to-face relation with said first electrode, said first and second electrodes adapted to receive an electrical signal which will cause said piezoelectric plate to vibrate primarily in the thickness vibrational mode;

first damping means comprising a third electrode located along the entirety of a first one of said widthwise edges and a damping material deposited entirely along said third electrode;

second damping means comprising a fourth electrode located along the entirety of said second widthwise edges and a damping material deposited entirely along said fourth electrode;

the distance G between that edge of said first electrode which is closest to one of said lengthwise edges of said piezoelectric plate and said one of said lengthwise edges of said piezoelectric plate, and the thickness T of the piezoelectric plate as measured between said planar surfaces satisfying the relationship $0 \leq G/T \leq 15$; and said first and third electrodes being electrically connected to each other and said second and fourth electrodes being electrically connected to each other.

2. A piezoelectric vibrator as claimed in claim 1, wherein said damping material is solder bead.

3. A piezoelectric oscillator as claimed in claim 1, wherein said damping material is an electrically conductive bonding agent.

4. A piezoelectric vibrator as claimed in claim 1, further comprising a first terminal leg extending from said third electrode.

5. A piezoelectric vibrator as claimed in claim 1, further comprising a second terminal leg extending from said fourth electrode.

6. A piezoelectric vibrator of energy trapped type which operates in the thickness vibrational mode, comprising:

an elongated ceramic piezoelectric plate having first and second half portions on respective sides of an imaginary center line drawn in the widthwise direction of said elongated piezoelectric plate at a position intermediate of the length of said piezoelectric plate, said plate having first and second opposed planar surfaces and opposite pairs of lengthwise and widthwise edges;

a first electrode deposited approximately at a center portion of said first half portion and on said first planar surface of the piezoelectric plate;

a second electrode deposited approximately at a center portion of said first half portion and on said second planar surface of said piezoelectric plate in face-to-face relation with said first electrode, said first and second electrodes adapted to receive an electrical signal which causes said elongated piezoelectric plate to vibrate primarily in the thickness mode;

a third electrode deposited approximately at a center portion of said second half portion and on said first planar surface of said piezoelectric plate;

a fourth electrode deposited approximately at a center portion of said second half portion and on said second planar surface of said piezoelectric plate in face-to-face relation with said third electrode, said third and fourth electrodes adapted to receive an electrical signal that causes said elongated piezoelectric plate to vibrate primarily in the thickness vibration mode;

the minimum distance G between the edge of each of the first and third electrodes and the edge of said lengthwise edges of said elongated piezoelectric plate, and the thickness T as measured between said planar surfaces of said piezoelectric plate satisfies the following relation: $0 \leq G/T \leq 15$;

first damping means located at said first widthwise edge of said elongated piezoelectric plate along the entire edge thereof;

second damping means located at said second widthwise edge of said elongated piezoelectric plate along the entire edge thereof; and third damping means applied at a center portion of said elongated piezoelectric plate along said center line.

7. A piezoelectric vibrator as claimed in claim 6, wherein said first damping means comprises: a fifth electrode deposited at said first widthwise edge of said elongated piezoelectric plate along the entire edge thereof, and a damping material deposited entirely on said fifth electrode.

8. A piezoelectric vibrator as claimed in claim 7, wherein said second damping means comprises: a sixth electrode deposited at said second widthwise edge of said elongated piezoelectric plate along the entire edge thereof, and a damping material deposited entirely on said sixth electrode.

9. A piezoelectric vibrator as claimed in claim 8, wherein said third damping means comprises: a seventh electrode deposited at said center portion of said elongated piezoelectric plate along said center line and on said second surface of said piezoelectric plate, and a damping material deposited entirely on said seventh electrode.

10. A piezoelectric vibrator as claimed in claim 7, 8 or 9, wherein said damping material is a solder bead.

11. A piezoelectric vibrator as claimed in claim 7, 8 or 9, wherein said damping material is an electrically conductive bonding agent.

12. A piezoelectric vibrator as claimed in claim 9, wherein each of said first and third electrodes includes two separate electrode segments which are located in side-by-side relation to each other.

13. A piezoelectric vibrator as claimed in claim 12, further comprising an intervening electrode deposited on said first planar surface of said piezoelectric plate, said intervening electrode extending between one separate electrode segment of said first electrode and one separate electrode segment of said second electrode.

14. A piezoelectric vibrator as claimed in claim 13, wherein the other separate electrode segment of the first electrode is connected to the fifth electrode and the other separate electrode segment of the second electrode is connected to the sixth electrode.

15. A piezoelectric vibrator as claimed in claim 14, further comprising an eighth electrode located on said first planar surface of said piezoelectric plate in face-to-face relation with said seventh electrode for establishing a capacitor element between said seventh and either electrodes, said eighth electrode being connected to said intervening electrode.

16. A piezoelectric vibrator as claimed in claim 14, further comprising first, second and third terminal legs connected to the fifth, sixth and seventh electrodes, respectively.

17. A piezoelectric vibrator as claimed in claim 16, further comprising first and second guard plates sandwiching the piezoelectric plate.

* * * * *